United States Patent [19]

Lynch et al.

[11] 3,840,978

[45] Oct. 15, 1974

[54] METHOD FOR POSITIONING AND BONDING

[75] Inventors: John R. Lynch, Fishkill; Leonard E. Otten, Poughkeepsie; Herbert Wenskus, Hopewell Junction, all of N.Y.

[73] Assignee: International Business Machines Corporation

[22] Filed: Oct. 12, 1971

[21] Appl. No.: 188,045

Related U.S. Application Data

[62] Division of Ser. No. 875,695, Nov. 12, 1969, Pat. No. 3,628,717.

[52] U.S. Cl. .................................... 29/493, 29/589
[51] Int. Cl. .......................... B23k 5/22, B23k 31/02
[58] Field of Search ....... 29/493, 589, 471.1; 228/4, 228/5, 6, 44, 47, 49

[56] References Cited

UNITED STATES PATENTS

| | | | |
|---|---|---|---|
| 3,005,257 | 10/1961 | Fox | 29/493 X |
| 3,165,818 | 1/1965 | Soffa et al | 29/493 X |
| 3,310,216 | 3/1967 | Kollner et al. | 228/5 |
| 3,357,091 | 12/1967 | Reissmueller et al. | 29/493 X |
| 3,382,564 | 5/1968 | Gallentine | 228/4 X |
| 3,452,917 | 7/1969 | Schneider | 228/4 X |
| 3,477,630 | 11/1969 | Schneider | 228/6 |
| 3,559,279 | 2/1971 | Miklaszewski | 29/589 X |
| 3,568,307 | 3/1971 | Zanger et al. | 29/589 |

*Primary Examiner*—J. Spencer Overholser
*Assistant Examiner*—Ronald J. Shore
*Attorney, Agent, or Firm*—William J. Dick

[57] ABSTRACT

This patent discloses a method and apparatus for aligning and joining a semiconductor chip to a substrate or carrier. The apparatus for first aligning and then bonding the chip to a substrate comprises a first system which includes first alignment means, immediately below the alignment means there being a substrate receiving means which is movable so as to permit alignment of the substrate in a predetermined position relative to the first alignment means. A second system cooperates with the first system and includes a vacuum-operated chip receiver. The first system is then moved until the chip is superimposed of the substrate and means are provided to press the chip into contact with the substrate. A heater located in the substrate receiving means heats the substrate and while the chip is being held against the substrate the substrate receiving means is rotated arcuately, the substrate bearing against the chip and causing a scrubbing action to inhibit the presence of voids in the bond interface.

4 Claims, 6 Drawing Figures

PATENTED OCT 15 1974 3,840,978

SHEET 1 OF 2

METHOD FOR POSITIONING AND BONDING

This is a division of application Ser. No. 875,695 filed Nov. 12, 1969, now U.S. Pat. No. 3,628,717 issued on Dec. 21, 1971.

SUMMARY OF THE INVENTION AND STATE OF THE PRIOR ART

The present invention relates to a method for joining a semiconductor chip to a substrate and more particularly relates to a method for attaching high-power dissipation chips to heat sinks.

Most manufacturers use standard eutectic diebonding techniques for attaching the reverse side or backside of integrated circuit or semiconductor chip to a heat sink. Either low frequency mechanical or ultrasonic scrubbing of a bare silicon chip surface against a gold substrate surface under temperature and pressure is the standard reverse side-bonding method used for attachment. Alternately, preforms of gold-silicon may also be used intermediate the chip surface and the heat sink substrate. Conventional die-bonding temperatures, in the standard back-bonding method, is approximately 420° C, conventional methods resulting in a gold-silicon interface normally containing approximately a 15 percent void volume which is considered both common and adequate. However, some bond interfaces exhibit a void volume as high as 40 percent. The higher the void content, the poorer the heat dissipation characteristics of the chip. Additionally, the thicker the bond interface, the higher the void content, the void percentage increasing generally with increasing interface thickness. Typical carrier or heat sink are composed of a low-expansion metal such as nickel-gold plated molybdenum or Kovar, and while copper dissipates more heat than either molybdenum or Kovar, it is a potentially dangerous reliability risk due to the poor thermal expansion match of copper and silicon.

In forming the bond, typically the chip must be scrubbed against the substrate for good gold-silicon formation. There have been two standard methods of accomplishing such a scrubbing, notably by ultrasonic means (ultrasonic frequency vibration mechanically moves the chip) and mechanical scrubbing (low frequency vibration of the chip).

The ultrasonic scrubbing during die bonding is a standard industrial technique. After application of a predetermined pressure to the top of a chip, a high frequency pulse is transmitted to an ultrasonic horn and chip holder. The pulse is helpful in breaking up any oxide glaze existing at the interface of the chip and the substrate but its effect on internal device metallurgy is not known, and the chip holder requires constant attention due to the variations in chip size and to the tendency of the ultrasonic vibration to create corner cracks.

Mechanical scrubbing is common and comprises vibrating the chip surface at low frequency against the plated substrate, moving the chip approximately ±0.005 inches along one axis. Since it is difficult to accurately predict device end location, and because this scrubbing method is hard on the chip, creating cracking problems, this method is not preferred.

In view of the above, it is a principal object of the present invention to provide a method for aligning and joining a semiconductor or integrated circuit chip to a substrate while bringing the void content in the interface between the chip and the substrate to a level of 10 percent or below, with typical void densities being in the order of 5 percent.

Another object of the present invention is to provide a novel method which permits the positioning of the substrate in a first predetermined, prealigned position and then positioning the alignment means and the substrate into a second position aligning a semiconductor chip or integrated circuit chip in superimposed relation relative to the substrate.

Still another object of the present invention is to provide a method of joining a semiconductor chip to a substrate by oscillating one of the chip and substrate relative to each other in an arcuate path and in contact with each other while applying heat so as to bond one to the other.

Other objects and a fuller understanding of the invention may be had by referring to the following specifications and claims taken in conjunction with the accompanying drawings in which:

Figure 1:
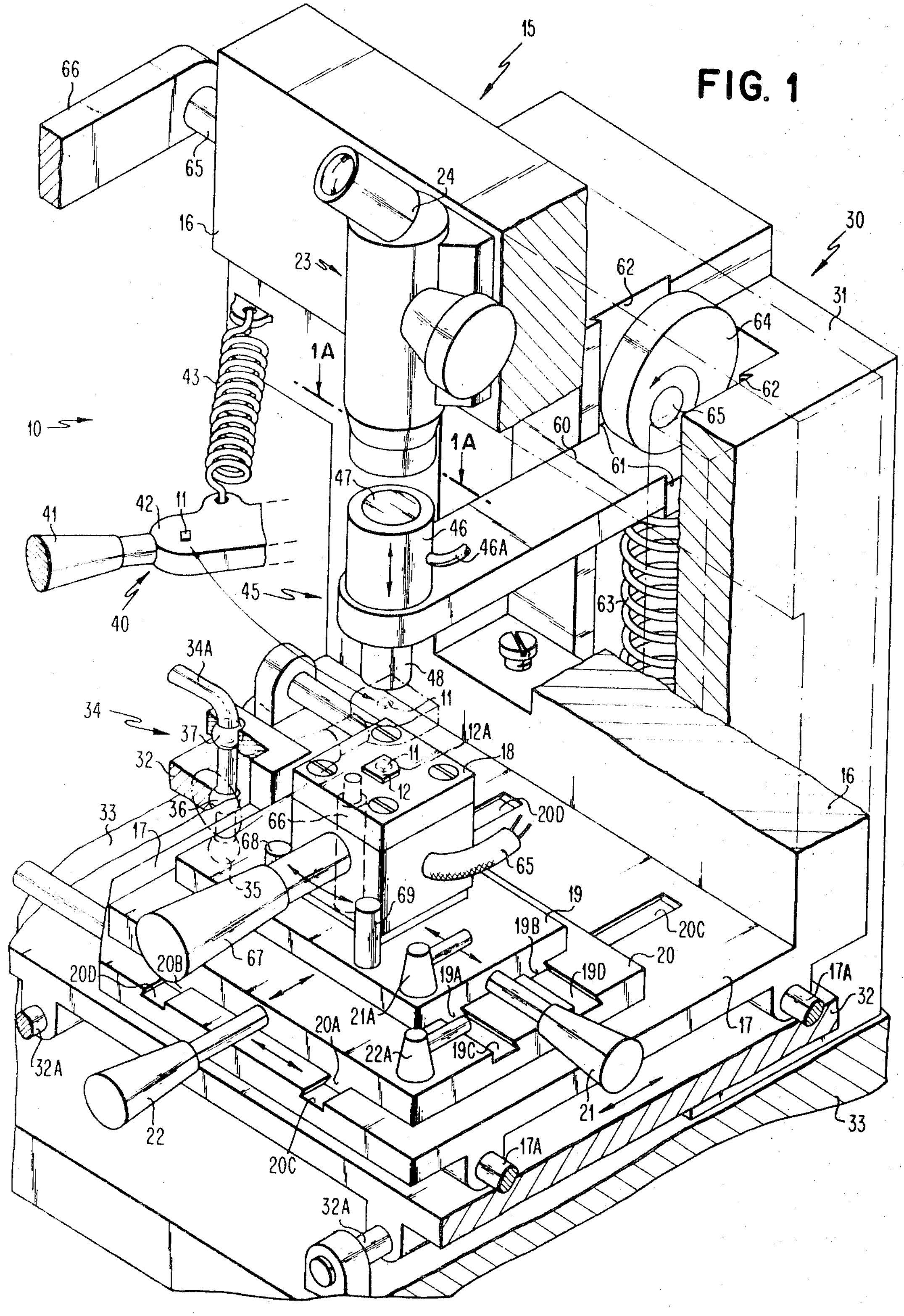
FIG. 1 is a fragmentary perspective view of the apparatus embodying the present invention.
Figure 3:
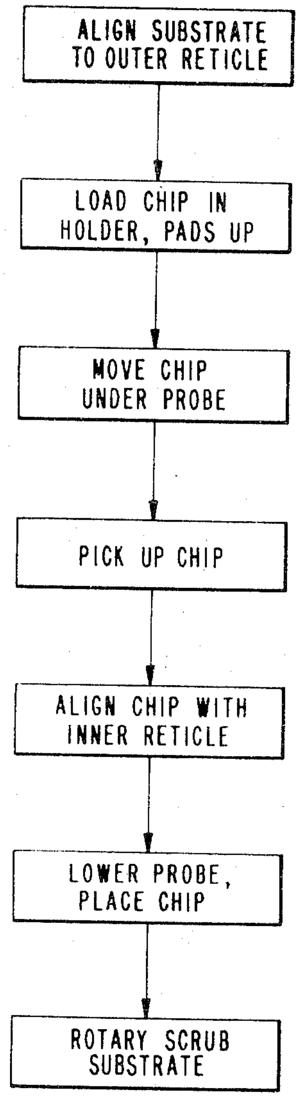
FIG. 3 is a block diagram illustrating the steps involved in aligning and joining the chip to the substrate.

Referring now to the drawing and especially FIG. 1 thereof, apparatus 10 for aligning and joining a semiconductor chip 11 to a substrate 12 is shown therein.

In accordance with the invention, the substrate is first positioned, a chip is then picked up with its conductive terminations 11A (see FIG. 2) facing upwardly, the chip then being properly aligned and positioned on the substrate, in the present instance the substrate being heated to permit attachment of the chip to the substrate. To this end, the apparatus 10 comprises a first location system 15 which includes an upstanding rear wall 16 to which is attached or connected a horizontally extending platform 17 the platform including a pivotively mounted substrate-receiving means 18 connected to or mounted on X–Y locating platforms 19 and 20 respectively which are positionable relative to the platform 17. As noted, each of the platforms 19 and 20 of the positioning means includes slides 19A, 19B, 20A, 20B, which cooperate respectively with grooves 19C, 19D, 20C, 20D of the next lower platform.

Each of the platforms 19 and 20 are or may be positioned as by the handles 21 and 22 respectively. Additionally, if desired, locks 21A and 22A may be provided to secure the platforms 19 and 20 to each other and to the platform 17.

Figure 1A:
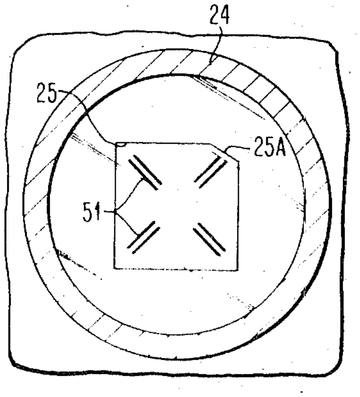
FIG. 1A is an enlarged fragmentary sectional view taken along line 1A — 1A of FIG. 1, upon proper alignment of the substrate.
Figure 1B:
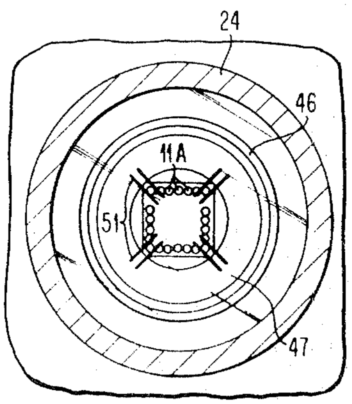
FIG. 1B is an enlarged fragmentary sectional view of a chip accurately positioned superimposed of the substrate shown in FIG. 1A and taken along line 1B — 1B of FIG. 1.

To permit proper alignment of the substrate-receiving means 18 as by the positioning means, a first alignment means 23 is provided. To this end, the first alignment means 23 comprises a microscope or other optics 24 which is mounted on the rear wall 16 of the first system 15. In practice, the substrate 12 is positioned in the substrate receiving means, the positioning means, i.e. platforms 19 and 20 being adjusted until the substrate 12 (FIG. 2) is aligned in a sighting means, in the illustrated instance a window-type frame reticle 25 (see FIG. 1A). For orientation purposes the substrate 12 includes orientation means, in the present instance a severed corner 12A to permit proper orientation of the substrate 12, in the sighting means 25 to thereby permit superimposed alignment with the substrate 12. As illustrated in FIG. 1A, the sighting means does include a recessed corner 25A in the frame reticle 25 for such alignment.

Figure 2:
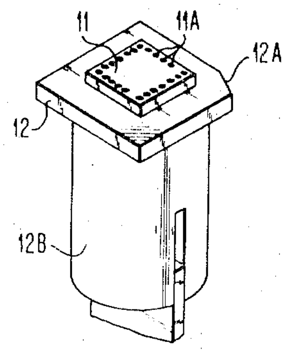
FIG. 2 is an enlarged fragmentary perspective view illustrating a semiconductor chip bonded to a substrate.

After initial alignment of the substrate 12 in the first system 15, it is necessary to bring the chip 11 into superimposed relation relative to the substrate. To this end, a second system 30 including an upstanding backwall 31 and a horizontally extending platform 32 which rests on the machine base 33 is shown in FIG. 2, the platform 17 being capable of reciprocation by slides 17A in one direction, the platform 32 as by slides 32A being reciprocable in a second direction 90° to the first and operated in these mutual perpendicular planes by a pivotally mounted orienting means 34. As illustrated, the orienting means 34 comprises a handle 34A which is pivotally connected as by a ball joint 35 anchored in the base 33, and a second ball joint 36, slidably mounted on the handle 34A and pivotally connected to the platform 32, to permit motion of that platform relative to the base, and a third ball joint 37, also slidably mounted on the handle 34 and connected to the platform 17. As will be seen, the handle 34 operates to position the first system 15 relative to the second system 30, the reason for moving the first system in lieu of the second system being more clearly explained hereinafter.

Figure 4:
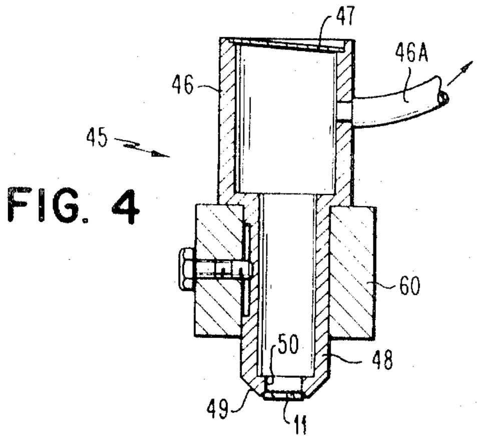
FIG. 4 is an enlarged fragmentary sectional view of the pickup tip of the apparatus shown in FIG. 1.

The chip 11 is first picked up by chip pickup means, and the first system 15 is then moved into a position aligning the chip and substrate in a predetermined orientation. To this end, a chip loader or loading means 40 including a handle 41 and a platform 42 is pivotally mounted (not shown) to move the loading means beneath a chip pickup or chip-receiving means 45. As shown in FIG. 4, the chip-receiving means 45 includes a tube 46 having a transparent glass or the like 47 at the upper portion therof. As illustrated, the tube 46 includes a necked down portion 48 which merges into a frusto-conical tip 49 having an aperture 50 therein communicating with the atmosphere. The tube 46 is connected by hose or the like 46A to a vacuum supply (not shown), and upon the loading means 40 coming into alignment with the tip 49 the receiving means will pick up the chip 11, the handle 41 of the loading means 40 then being released, and the loading means 40 being returned to its initial position as by a spring 43. Alternatively, the chip receiving means may take the form of the chip receiving means illustrated in the copending application of J. R. Lynch and L. E. Otten, Ser. No. 834,783, filed June 19, 1969, now U.S. Pat. No. 3,572,736, issued on Mar. 30, 1971 and owned by the assignee of the present application.

Upon pick up of the chip, platform 17 and 32 are adjusted as by the handle 34A until the operator aligns, through the optics 24, the chip held by the chip-receiving means 45. In the illustrated instance, the alignment of the chip is accomplished by moving the first system until the chip lines up in the inner reticles 51 in the optics 24 associated with the alignment means 23.

Inasmuch as the optics 24 are utilized to accurately position the substrate 12 on the substrate-receiving means 18, and that same optics are used for aligning the chip 11 in the reticle 51, upon the alignment occurring, the chip 11 is in superimposed relation relative to the substrate 12.

After the chip and substrate are vertically aligned, as described above, the chip is brought into mating engagement with the substrate and a bond is effected between the substrate and the chip. To this end, and as best illustrated in FIG. 1, the chip-receiving means 45 is connected to a beam 60 having dovetail slides 61 which cooperate with like grooves or passages 62 in the upstanding rear wall 31 of the second system 30. As illustrated, the beam is biased upwardly by biasing means in the present instance a spring 63, and is actuable downwardly as by a cam 64 connected to a shaft 65 and operable as by a hand lever or the like 66. As it may easily be visualized, downward motion of the handle 66 causes rotation of the shaft 65 affecting arcuate movement of the cam 64, camming the beam 60 and thus the chip-receiving means 45 downwardly until the chip bears against the substrate 12.

With regard to the bonding of the chip to the substrate, the chip and substrate may be of any bondable material, for example, at least the reverse or the backside of the chip may be composed of a very clean silicon or gold and silicon, the gold having been deposited by evaporation onto the silicon. The substrate, for example, may be composed of molybdenum, in the present instance a square, to which has been bonded a heat sink 12B (see FIG. 2), the molybdenum square having deposited thereon 15 to 20 microinches of nickel and then 15 to 20 microinches of 24 carat gold. The substrate may then be fired at approximately 700° C. and diffusion takes place. The substrate is then plated with 100 microinches of gold. It should be recognized that this is only one example of a typical substrate which may be used in the bonding operation.

In order to effectively bond the chip to the substrate, it is necessary that the temperature of the interface be approximately 400° C. to permit the gold or gold-silicon to form an intimate bond. To this end, and in accordance with a feature of the invention, the chip and substrate, once in contact, are rotated relative to one another to eliminate voids occurring in the melted interface. The bonding may take place in a reducing atmosphere for superior results, although it is not absolutely essential that it be accomplished in this atmosphere. Nitrogen may also be used but does result in the formation of an oxide on solder so that a forming gas (5 percent H2, 95 percent $N_2$) is preferable. As noted in FIG. 1, the substrate-receiving means 18 includes a heater element (not shown) which is connected as by wires 65 to a source of e.m.f. The substrate-receiving means 18 is pivotally mounted, in the present instance by a pin 66 mounted perpendicular to the platform 19, and rotatable therein. The pivot pin 66 is preferably eccentrically mounted with respect to the central vertical axis of the receiving means 18, so as to eliminate or inhibit the possibility of any dead spots of rotation intermediate the chips and substrate upon rotation. A limited rotation of the substrate relative to the chip is effected by the handle 67 connected to the substrate-receiving means 18 which arcuate movement is limited by accurately spaced stops 68 and 69 also connected to the platform 19. In this manner, motion of the handle 67, when the chip 11 is in contact with the substrate 12, permits or gives a rotational movement to the substrate and chip causing a rubbing action which effects elimination of the majority of voids in the interface between the chip and substrate. After such rotation has been effected power is removed from the leads 65 and the heater is shut off.

We claim:

1. A method of aligning and joining a semiconductor chip to a bondable substrate, said method comprising the steps of: fixing one of a chip and substrate in a first system; fixing the other of said chip and substrate in a second system, aligning one of said systems to the other of said systems until one of said chip and said substrate is aligned with the other in superimposed relation; bringing said chip and substrate into intimate contact; heating at least one of said chip and said substrate to a temperature sufficient to thermally bond, one to the other; and oscillating said chip and said substrate against one another in an arcuate path to thereby inhibit the presence of voids intermediate said chip and substrate.

2. A method of aligning and joining a semiconductor chip to a bondable substrate, in accordance with claim 1, including, prior to said fixing steps, the step of separating said first system from said second-system.

3. A method of aligning and joining a semiconductor chip to a bondable substrate, in accordance with claim 1, wherein said first fixing step includes the step of aligning one of said substrate and chip to a first reference; and then aligning said other of said chip and substrate to a second reference related to said first reference.

4. A method of aligning and joining a semiconductor chip to a bondable substrate, in accordance with claim 3, wherein said aligning of said other of said chip and substrate to a second reference includes the step of moving only said one of said chip and substrate until said second reference indicates alignment of said chip and said substrate.

* * * * *